US011467213B2

(12) United States Patent
Baker et al.

(10) Patent No.: US 11,467,213 B2
(45) Date of Patent: Oct. 11, 2022

(54) DEFECT DETECTOR IN POWER DISTRIBUTION SYSTEM

(71) Applicant: Florida Power & Light Company, Juno Beach, FL (US)

(72) Inventors: Robert A. Baker, Westlake, FL (US); Nerva Kenol, West Palm Beach, FL (US); Andrew W. Kirby, Jupiter, FL (US); Jacob Benator, Palm Beach Gardens, FL (US); Michelet Orange, Royal Palm Beach, FL (US); Clive K C Leung, Westlake, FL (US); Charles E. Orr, Boca Raton, FL (US); Justin D Klocman, Boca Raton, FL (US); Benny P. Pazhayattil, Pembroke Pines, FL (US)

(73) Assignee: FLORIDA POWER & LIGHT COMPANY, Juno Beach, FL (US)

( * ) Notice: Subject to any disclaimer, the term of this patent is extended or adjusted under 35 U.S.C. 154(b) by 327 days.

(21) Appl. No.: 16/779,900

(22) Filed: Feb. 3, 2020

(65) Prior Publication Data
US 2021/0239760 A1    Aug. 5, 2021

(51) Int. Cl.
  *G01R 31/02*   (2006.01)
  *G01R 31/327*  (2006.01)
  *G01R 31/08*   (2020.01)

(52) U.S. Cl.
  CPC ....... *G01R 31/3274* (2013.01); *G01R 31/085* (2013.01); *G01R 31/088* (2013.01)

(58) Field of Classification Search
  CPC .... G01R 31/008; G01R 31/085; G01R 31/52; G01R 31/1245; G01R 31/1227; G01R 31/1272; H01B 17/005; H01B 17/02
  See application file for complete search history.

(56) References Cited

U.S. PATENT DOCUMENTS

| 3,601,659 | A | * | 8/1971 | Tanaka .................. H02H 3/003 307/85 |
| 4,378,524 | A | | 3/1983 | Steinmuller |
| 5,216,356 | A | | 6/1993 | Owen |
| 6,965,806 | B2 | | 11/2005 | Eryurek et al. |
| 8,907,679 | B2 | | 12/2014 | Tan |
| 9,300,126 | B2 | | 3/2016 | Schaper et al. |

(Continued)

OTHER PUBLICATIONS

Dan Reckerd, et al., "Application of Peer-to-Peer Communication, for Protection and Control, at Seward Distribution Substation" IEEE 2005.

(Continued)

*Primary Examiner* — Thang X Le
(74) *Attorney, Agent, or Firm* — Tarolli, Sundheim, Covell & Tummino LLP

(57) ABSTRACT

A defect detector can receives voltage data characterizing a three-phase voltage for each of a plurality of feeder lines. The defect detector generates an alert indicating that a potential defect exists at a switch upstream of the plurality of feeder lines in response to the voltage data indicating (i) a drop in two or more phases of voltage at a given feeder line of the plurality of feeder lines occurred within a predetermined amount of time of toggling of the switch or (ii) a drop in two or more phases of voltage on at least two or more feeder lines of the plurality of feeder lines has occurred.

20 Claims, 5 Drawing Sheets

(56) References Cited

U.S. PATENT DOCUMENTS

| | | | |
|---|---|---|---|
| 9,857,406 B2 | 1/2018 | Yun | |
| 2002/0113599 A1* | 8/2002 | Hoffman | H02H 7/04 |
| | | | 324/547 |
| 2017/0294846 A1* | 10/2017 | Daley | H02M 5/12 |
| 2018/0316186 A1* | 11/2018 | Klocman | H02J 13/0004 |
| 2019/0237966 A1* | 8/2019 | Porter | G01R 19/16547 |
| 2019/0245342 A1* | 8/2019 | Sharon | H02H 1/0007 |
| 2020/0326363 A1* | 10/2020 | sun | H02H 1/0092 |
| 2021/0072303 A1* | 3/2021 | Aleman | H02H 1/0007 |

OTHER PUBLICATIONS

Craig Wester, et al., "Fully Monitoring Industrial Protection and Control Systems" IEEE 2012.

\* cited by examiner

DEFECT DETECTOR IN POWER DISTRIBUTION SYSTEM

TECHNICAL FIELD

The present disclosure relates to power distribution systems. More particularly, this disclosure relates to a defect detector detecting a potential defect in a switch of a power distribution system.

BACKGROUND

Three-phase electric power is a common method of alternating current electric power generation, transmission and distribution. Three-phase electric power is a type of polyphase system and is the most common method used by electrical grids worldwide to transfer power. In three-phase power, conductors between a voltage source and a load are referred to as lines, and the voltage between any two lines is referred to as a line voltage. The voltage measured between any line and a neutral (e.g., ground) is referred to as a phase voltage.

A delta-wye transformer is a type of three-phase electric power transformer design that employs delta-connected windings (or simply referred to as delta windings) on the primary windings and wye/star connected windings (or simply referred to as wye windings) on the secondary windings of the transformer. A neutral wire can be provided on the wye output side. A delta-wye transformer can be a single three-phase transformer, or built from three independent single-phase units. The delta-wye transformer can alternatively be referred to as a delta-star transformer.

Delta-wye transformers are common in commercial, industrial and high-density residential locations to supply three-phase distribution systems. As an example, a delta-wye transformer could be used as a distribution transformer with a delta primary winding, running on three 230 or 115 kilovolt (kV) phases with no neutral or earth required, and a wye secondary winding providing a 3-phase supply at 13.8 or 23 kV between each phase and the earthed (grounded) neutral point.

SUMMARY

One example relates to a non-transitory machine readable medium having machine executable instructions, the machine executable instructions can include a defect detector that receives voltage data characterizing a three-phase voltage for each of a plurality of feeder lines. The defect detector generates an alert indicating that a potential defect exists at a switch upstream of the plurality of feeder lines in response to the voltage data indicating (i) a drop in two or more phases of voltage at a given feeder line of the plurality of feeder lines occurred within a predetermined amount of time of toggling of the switch or (ii) a drop in two or more phases of voltage on at least two or more feeder lines of the plurality of feeder lines has occurred.

Another example relates to a system that includes a plurality of three-phase transformers, each having a primary winding and a secondary winding. The system can also include a plurality of feeder lines, wherein each feeder line is coupled to the secondary winding of a respective three-phase transformer of the plurality of three-phase transformers. The system can further include a plurality of switches, wherein each switch is upstream of the primary winding of a respective three-phase transformer of the plurality of three-phase transformers. The system can still further include a plurality of three-phase voltage meters, wherein each three-phase voltage meter reads a three-phase voltage of a respective feeder and provides voltage data. The system can yet further include a memory for storing machine executable instructions and a processing unit comprising one or more processor cores that access the memory and executes the machine readable instructions. The machine readable instructions can include a defect detector that receives the three-phase voltage data from each of the plurality of three-phase voltmeters. The defect detector can generate an alert indicating that a potential defect exists at a given switch the plurality of switches in response to the voltage data indicating a drop in two or more phases of voltage at a given feeder line of the plurality of feeder lines within a predetermined amount of time of toggling of the given switch or a drop in two or more phases of voltage of at least two or more feeder lines of the plurality of feeder lines. The machine readable instructions further include a graphical user interface that outputs data uniquely identifying the given switch from the plurality of switches.

Yet another example relates to a method that includes detecting at least one of a drop in two or more phases of voltage at a given feeder line of a plurality of feeder lines within a predetermined amount of time of toggling of a switch upstream of the plurality of feeder lines and a drop in two or more phases of voltage of at least two or more feeder lines of the plurality of feeder lines. The method also includes identifying a defect in a switch upstream of the plurality of feeder lines in response to the voltage drop, wherein at least one three-phase transformer galvanically isolates the switch from the plurality of feeder lines.

DETAILED DESCRIPTION

Figure 1:
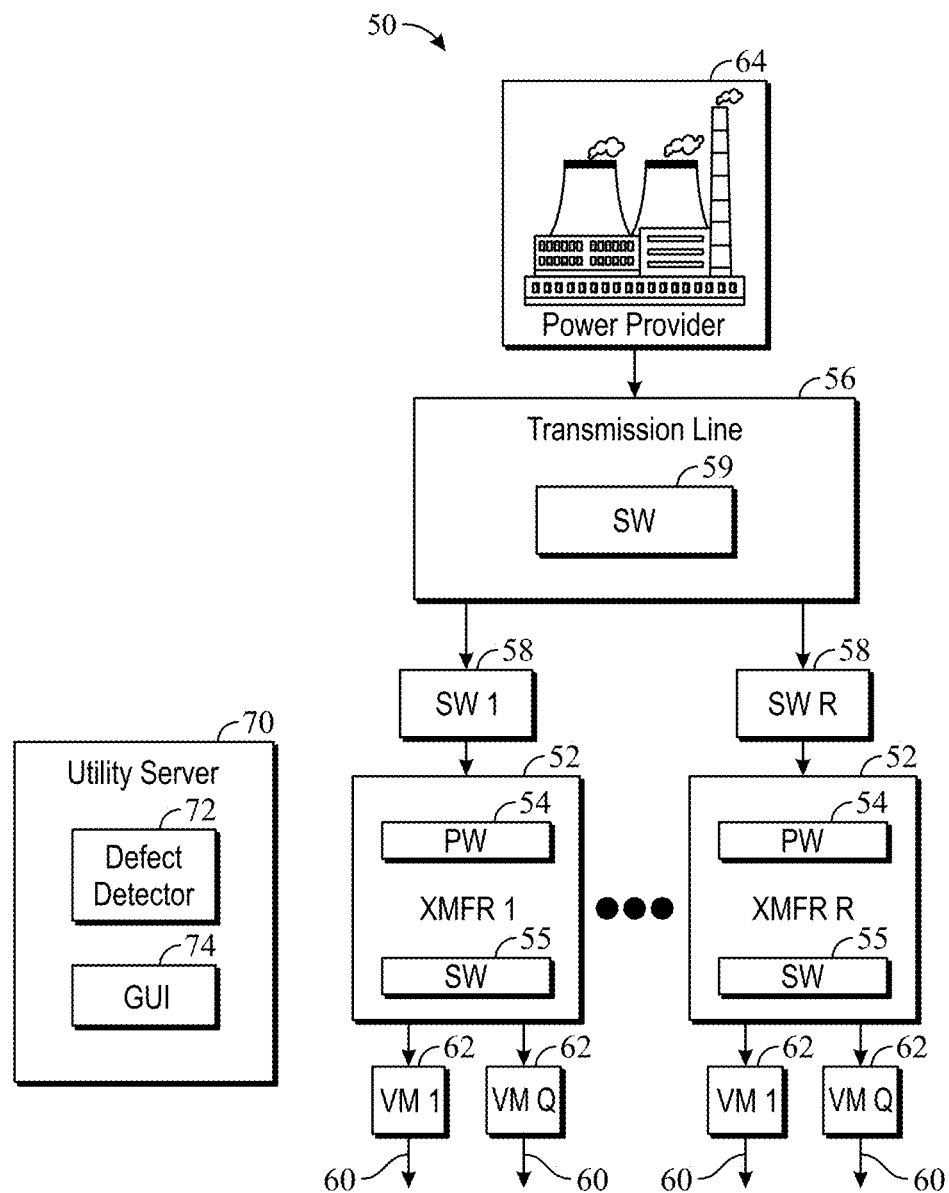
FIG. 1 illustrates an example of a power distribution system that detects potentially damaged or improper operation of switches.

The present disclosure relates to a system such as a Power Delivery Diagnostic Center (PDDC) for a power distribution system that can generate an alert to uniquely identify electrical equipment associated with a three phase delta-wye transformer at a substation and/or a three phase transmission line upstream from the substation that is malfunctioning due to improper operation and/or equipment damage. More particularly, the system includes a defect detector that monitors signals from three-phase voltmeters attached to feeder lines downstream from delta-wye transformers and transmission lines. The defect analyzes the voltage signals and triggers an alert requesting inspection of the components (e.g., switches) associated with the delta-wye transformers and/or the transmission lines when specific criteria is met. The alert can be employed to generate a service ticket (e.g., a work order) for a service crew to inspect and/or repair the electrical equipment associated with a specific delta-wye transformer and/or transmission line.

As one example, if one or more switches implemented as high-side transformer (TX) interrupters (alternatively referred to as an F-switch) events are detected (e.g., tripping, opening and/or closing of the high-side TX interrupter) for a given high-side TX interrupter downstream from a transformer, and a three-phase voltmeters monitoring a feeder voltage signal downstream of the given high-side TX interrupter indicates that two or more phases of voltage have dropped below a threshold level (e.g., two-thirds of a standard operating voltage) within a predetermined amount of time (e.g., 5-20 minutes), a defect detector of the PDDC can trigger an alarm for the given high-side TX interrupter. In another example, if two or more three-phase voltmeters within a substation monitoring a feeder voltage signals that are each downstream from a particular high-side TX interrupter indicate that two or more phases of voltage have contemporaneously dropped below a threshold level (e.g., two-thirds of a standard operating voltage) the defect detector of the PDDC can trigger an alarm for the particular high-side TX interrupter. In yet another example, if two or more three-phase voltmeters at different substations monitoring a feeder voltage signal that are each downstream from a given transmission line switch indicate that two or more phases of voltage have contemporaneously dropped below a threshold level (e.g., two thirds of a standard operating voltage) the defect detector of the PDDC can trigger an alarm for the given transmission switch.

As described, the defect detector of the PDDC can detect a potential failure in the electrical equipment (e.g., the high-side TX interrupter and/or the transmission line switch) without directly monitoring a voltage on a transformer of a substation or a transmission line upstream from the substation. Rather, data from three-phase voltmeters downstream from the transformer and transmission line can be extrapolated to identify instances of such potentially damaged electrical equipment.

FIG. 1 illustrates a block diagram of a power distribution system 50. The power distribution system 50 can include R number of three-phase transformers 52 (labeled "XMFR"), wherein R is an integer greater than or equal to two. Each three-phase transformer 52 has a primary winding 54 and a secondary winding 55. Each three-phase transformer 52 can be implemented, for example, as a delta-wye transformer, wherein the primary winding 54 is implemented as delta windings and the secondary winding 55 is implemented as wye-windings.

A transmission line 56 can be connected to the primary winding 54 of each three-phase transformer 52. Additionally, a switch 58 (e.g., a high-side TX interrupter) can be physically and logically positioned upstream of each primary winding 54, such that there are R number of switches 58. In situations where a given switch 58 is opened, power does not flow to the primary winding 54. Conversely, in situations where the given switch 58 is closed, power flows through the transmission line 56 to the primary winding 54. Further, a switch 59 (e.g., a transmission line switch) can be coupled along the transmission line 56. If the switch 59 is opened, no power is provided to any of the downstream primary windings 54 of the three-phase transformers 52. Conversely, if the switch 59 is closed, power flows to each switch 58 and to each downstream primary winding 54 of a corresponding three-phase transformer 52.

Q number of feeder lines 60 can be connected to the secondary winding 55 of each three-phase transformer 52, where Q is an integer greater than or equal to one. Moreover, each three-phase transformer 52 can have a different number of feeder lines 60 connected thereto. Each feeder line 60 can carry a three-phase voltage signal that can be provided to a plurality of customer premises via additional electrical equipment (e.g., additional transformers and transmission lines). A three-phase voltmeter 62 can be coupled to each of transmission lines, such that there are Q number of three-phase voltmeters 62 downstream of each secondary winding 55 of each three-phase transformer 52.

A power provider 64 can provide three-phase power on the transmission line 56. The power provider 64 can be representative of a power generator, such as a power plant such as a wind farm, a solar system, a thermal solar field, a fossil fuel based power generator (e.g., a coal or natural gas power generator) or a nuclear power generator and attendant constituent structures or any combination thereof. Alternatively, the power provider 64 could be implemented as a stored power system (e.g., a battery system).

A utility server 70 can communicate directly or indirectly with electrical components of the power distribution system 50. The utility server 70 can include a memory for storing machine executable instructions and a processing unit comprising one or more processor cores that access the memory and executes the machine readable instructions. In some examples, the utility server 70 can be implemented as a stand-alone server or part of an enterprise system (e.g., in a computing cloud) or in communication with such an enterprise system, such as a supervisory control and data acquisition (SCADA) system.

The utility server 70 can include a defect detector 72 that can identify potentially damaged or otherwise improperly operating switches, such as the switches 58 (high-side TX interrupters) or the switch 59 (transmission line switch). The defect detector 72 can be implemented as part of a power delivery diagnostic center (PDDC). The defect detector 72 can receive voltage data from each of the plurality of three-phase voltmeters 62. The voltage data (e.g., three-phase voltage data) from each of the three-phase voltmeters 62 can characterize a present voltage for each of the three-phases of a corresponding feeder line 60. In some examples, the defect detector 72 can also receive an indication of a status of each of the switches 58 and the switch 59 (e.g., tripped, opened, or closed). The defect detector 72 can be programmed to generate an alert indicating that a potential defect exists at a given switch the plurality of switches 58 (e.g., high-side TX interrupters) or the switch 59 (e.g., transmission line switch) in response to the voltage data indicating one of the following:
  (i) a drop in one or more phases of voltage at a given feeder line 60 of the plurality of feeder lines 60 within a predetermined amount of time of toggling (e.g., tripping, opening and closing) of the corresponding switch 58 or the switch 59, or
  (ii) a drop in one or more phases of voltage of at least two or more feeder lines 60 of the plurality of feeder lines 60.

The utility server 70 can also include a graphical user interface (GUI) 74 that outputs data uniquely identifying the given switch 58 or 59 from the plurality of switches 58 or 59. In some examples, the alert can be output by the GUI 74 as a chart. In this manner, defective switches (e.g., switches with an open pole) can be easily identified without the installation of additional hardware on the power distribution system 50.

Figure 2:
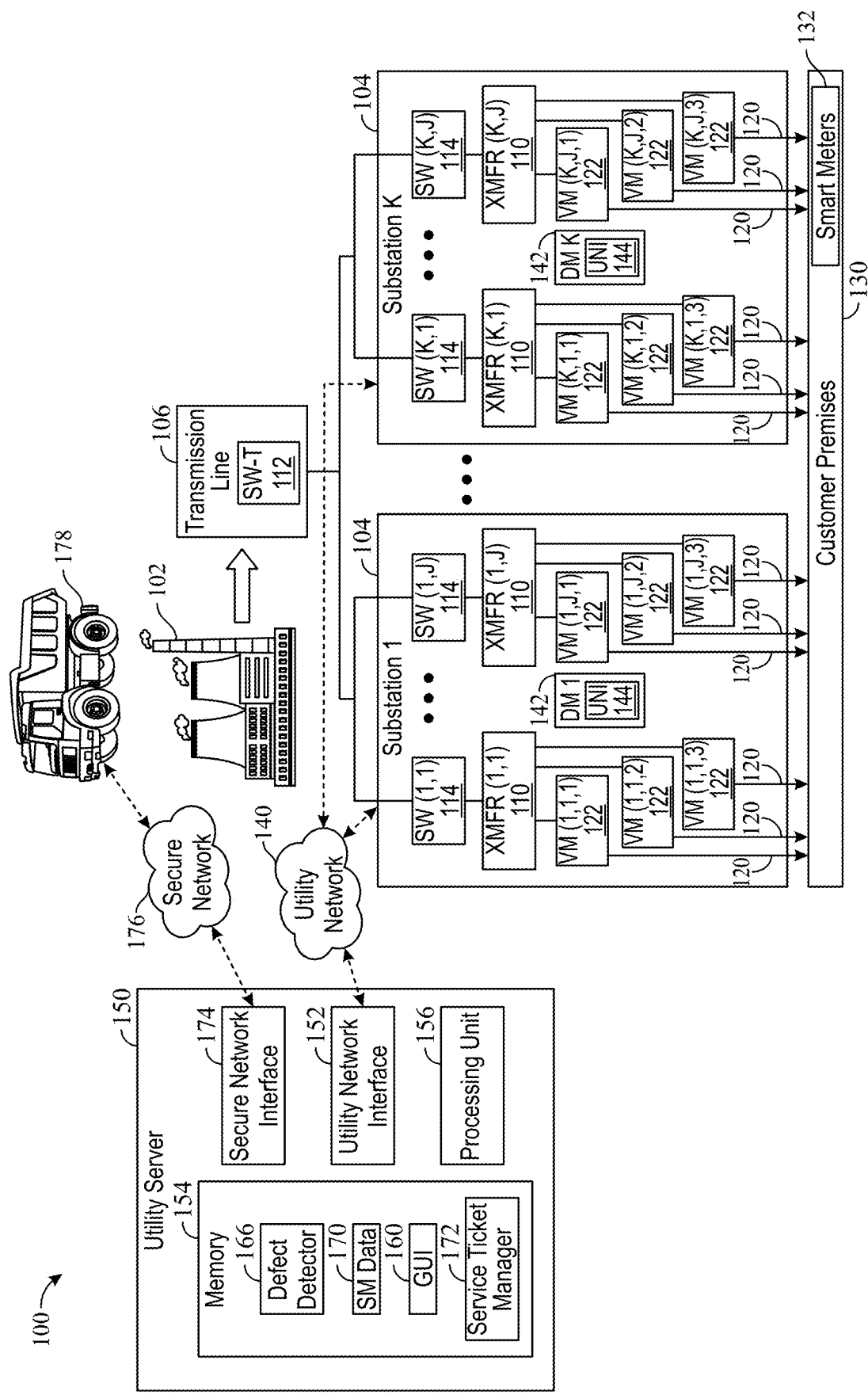
FIG. 2 illustrates another example of a power distribution system that detects potentially damaged or improper operation of switches.

FIG. 2 illustrates another example of a power distribution system 100 that can detect potential defects in power equipment downstream from a power provider 102. The power provider 102 can provide electrical power. In some examples, the power provider 102 can generate electric power, and in other examples, the power provider 102 can supply stored electrical power. The power provider 102 could be implemented as a power plant, such as a wind farm, a solar system, a thermal solar field, a fossil fuel based power generator (e.g., a coal or natural gas power generator) or a nuclear power generator and attendant constituent structures or any combination thereof. Alternatively, the power provider 102 could be implemented as a stored power system (e.g., a battery system). The power provider 102 can transmit a high-voltage, alternating current (AC) power signal (such as a 115 or 220 kilovolt (kV) AC power signal) to K number of substations 104 via a transmission line 106 (e.g., a single transmission line or multiple transmission lines), where K is an integer greater than or equal to one.

Each of the K number of substations 104 can transform the high voltage AC power signal into a mid-voltage power signal. For example, it may be desirable in some circumstances to step down (or to step up) voltage via one or more substation 104 electrical components, to phase-shift and/or otherwise to adjust current phase or amplitude, for instance, to achieve a desired power function as specified by the kind of load and/or to minimize energy lost in the power distribution system 100. As one example, each of the K number of substations 104 can include J number of three-phase transformers 110 (labeled "XMFR") for transforming and conditioning a 230 kV or 115 kV AC signal into a 13.8 kV AC signal or 23 kV AC signal. It is to be appreciated that in yet other examples, different input and output voltages could be implemented. In each such situation, each substation 104 can have the same or different number of three-phase transformers 110. It is noted that the power distribution system 100 may include more than one power provider 102.

Each of the J number of three-phase transformers 110 includes a two-dimensional index number (i,j). In such a situation, the first number, i identifies a substation 104 in which the three-phase transformer 110 is located. The second number, j, indicates the number of the three-phase transformer 110 within a respective substation 104. As an example, the first three-phase transformer 110 in the Kth substation 104 is labeled and referred to as the three-phase transformer (K,1). Similarly, the Jth three-phase transformer 110 in the first substation 104 is labeled and referred to as the three-phase transformer (1,J). In this manner, each three-phase transformer 110 can be uniquely identified.

Each of the J number of three-phase transformers 110 at each of the K number of substations 104 can be implemented a delta-wye transformer. In such a situation, the transmission line 106 can be connected to a primary winding (e.g., a delta winding) at each of the J number of three-phase transformers 110.

A transmission line switch 112 (labeled SW-T) can be logically and physically positioned along the transmission line 106. The transmission line switch 112 can have two states. In an open state, the transmission line switch 112 disconnects power flowing between the power provider 102 and each of the J number of three-phase transformers 110 at each of the K number of substations 104. Conversely, in a closed state, the transmission line switch 112 allows electricity to flow from the power provider 102 to each of the J number of three-phase transformers 110 at each of the K number of substations 104.

Similarly, switches implemented as high-side TX interrupters 114 (labeled "SW") can be physically and logically connected upstream of each of the K number of three-phase transformers 110 along the transmission line 106. Each of the high-side TX interrupters 114 can include a closed state that allows power to flow to a downstream three-phase transformer 110 and an open state that prevents power from flowing to the downstream three-phase transformer 110. Each high-side TX interrupter 114 is labeled with the same index number as the downstream three-phase transformer 110. For instance, the high-side TX interrupter (1,1) is upstream of the three-phase transformer (1,1).

Feeder lines 120 can be connected downstream from each three-phase transformer 110. More particularly, each feeder line 120 can be connected to a secondary winding of a respective three-phase transformer 110. In examples where each three-phase transformer 110 is implemented as a delta-wye transformer, each feeder line 120 can be coupled to a wye winding of the respective three-phase transformer 110. In this manner, components upstream from each three-phase transformer 110, including each high-side TX interrupter 114 and the transmission line switch 112 are galvanically isolated from the feeder lines 120.

In the example illustrated, each three-phase transformer 110 has three (3) feeder lines 120 connected downstream. However, in other examples, there could be more or less feeder lines 120 connected to each three-phase transformer 110. Additionally, different three-phase transformers 110 can have different number of feeder lines 120 connected. Each feeder line 120 can carry a three-phase voltage signal that can be monitored by a respective three-phase voltmeter 122. Each three-phase voltmeter 122 can monitor a voltage on each phase of the feeder line 120 (carrying a three-phase voltage signal). Additionally, each three-phase voltmeter 122 can generate voltage data characterizing a present voltage on each phase of the feeder line 120. Each three-phase voltmeter 122 is labeled an index number (i,j,k), where i,j identify the upstream transformer and the index number k identifies the particular three-phase voltmeter 122 and the feeder line 120 to which the three-phase voltmeter 122 is connected.

Each feeder line 120 can supply voltage to a plurality of downstream customer premises 130. Each customer premise 130 can be implemented as an industrial or residential consumer of electric power. Additionally, each customer premise 130 can be equipped with a smart meter 132 (alternatively referred to as a meter) that can monitor an incoming power signal and consumption at the respective customer premises 130.

In the example illustrated, the plurality of customer premises 130 and the smart meters 132 are collectively represented by a single component. In practice, there can be hundreds or thousands of individual customer premises 130. Additionally, electrical infrastructure downstream from the K number of substations 104, such as step-down transformers are omitted for purposes of simplification of explanation. Furthermore, it is understood that each customer premises 130 may be connected (directly or indirectly) to a subset of the feeder lines 120 in contrast to the example illustrated, in which every feeder line 120 is connected to the collective representation of the plurality of customer premises 130.

The transmission line switch 112 can be connected to a utility network 140. Similarly, each high-side TX interrupter 114 can be connected to the utility network 140 via a data monitor 142 installed at each of the K number of substations 104. The data monitor 142 can be implemented, for example, as a computing device (e.g., a programmable logic controller or a general purpose computer). The data monitor 142 can include a utility network interface (UNI) 144 for communicating on the utility network 140. The utility network interface 144 could be a wireless or wired network interface card configured to communicate on the utility network 140. The utility network 140 could be a mesh network, such as an Internet Protocol version 6 (IPv6) network or a network that employs the Transmission Control Protocol/Internet Protocol (TCP/IP).

For purposes of simplification of explanation, individual connections between the utility network 140 and each data monitor 142 are omitted. Instead, a collective connection between each substation 104 and the utility network 140 is included to collectively represent communications between components within a respective substation 104 and the utility network 140. The transmission line switch 112 and each high-side TX interrupter 114 can provide switch data characterizing an operating state (e.g., tripped, open or closed). Additionally, each three-phase voltmeter 122 can provide voltage data characterizing a (real-time) measured voltage for each phase of a respective feeder line 120 to the corresponding data monitor 142.

A utility server 150 (e.g., a computer system) can also be connected to the utility network 140 via a utility network interface 152 (e.g., a network interface card). The utility server 150 can be implemented by a utility provider (e.g., a power provider), such as a utility provider that controls the K number of substations 104 and/or the power provider 102. The utility server 150 can include memory 154 to store machine executable instructions. The memory 154 can be implemented as a non-transitory machine readable medium. The memory 154 could be volatile memory (e.g., random access memory), non-volatile memory (e.g., a hard drive, a solid state drive, flash memory, etc.) or a combination thereof. The utility server 150 can include a processing unit 156 (e.g., one or more processor cores) that accesses the memory 154 and executes the machine readable instructions.

In some examples, the utility server 150 can be (physically) implemented at facilities controlled by the utility provider. In such a situation, the utility server 150 could be representative e of multiple servers (e.g., a server farm). Additionally or alternatively, the utility server 150 (or a portion thereof) can be implemented in a remote computing system, such as a computing cloud. In such a situation, features of the utility server 150, such as the processing unit 156, the utility network interface 152 (and/or other network interfaces) and the memory 154 could be representative of a single instance of hardware or multiple instances of hardware with applications executing across the multiple of instances (i.e., distributed) of hardware (e.g., computers, routers, memory, processors, or a combination thereof). Alternatively, the utility server 150 could be implemented on a single dedicated computing device.

The utility network 140 can, in some examples, be implemented on (e.g., connected to) a public network, such as the Internet, a private network (e.g., a proprietary network) or a combination thereof (e.g., a virtual private network). In this manner, the utility server 150 can establish bi-directional communication with each of the K number of data monitors 142 (or some subset thereof) via the utility network 140. Similarly, the utility server 150 can establish bi-directional communication with the transmission line switch 112 that may be outside the K number of substations 104.

The memory 154 can store application software for controlling operations of the utility provider. In some examples, the application software can include operations as part of a power delivery diagnostic center (PPDC) and/or a supervisory control and data acquisition (SCADA) system. For example, the memory 154 can store application software for processing and billing systems, various monitoring, customer service, troubleshooting, maintenance, load balancing, accounting and other types of activities that may be used to operate a utility provider.

The memory 154 can include a graphical user interface (GUI) 160 that can operate as a front end for a defect detector 166 that monitors data generated by the components of the substations 104 and/or the transmission line 106 to detect potentially improper operation and/or equipment damage. More particularly, the defect detector 166 can monitor the switch data from the transmission line switch 112 and each of the J number of high-side TX interrupters 114 at each of the K number of substations 104 as well as voltage data from each of the three-phase voltmeters 122. The monitored data can be employed, for example, to identify a potential open pole (or other defect) on the transmission line switch 112 and/or on a high-side TX interrupter 114. In some examples, switch data from the high-side TX interrupters 114 and/or the transmission line switch 112 and/or voltage data from the three-phase voltmeters 122 can be provided directly to the utility server 150. In other examples, switch and/or voltage data may be provided from another server (e.g., operating on a SCADA system).

To demonstrate operations of the utility server 150, several extended examples are provided. In a first example, (hereinafter, "the first example"), it is presumed that the high-side TX interrupter (1,J) (labeled "SW (1,J)") has been tripped, opened and reclosed (e.g., toggled). In this situation, the high-side TX interrupter (1,J) provides switch data to the data monitor 142 of the first substation 104.

In response to detecting toggling (e.g., tripping, opening and/or closing) of the high-side TX interrupter 114 the defect detector 166 monitors the voltage data from three-phase voltmeters 122 for each of the feeder lines 120 downstream of the high-side TX interrupter 114 for a predetermined amount of time (e.g., 5-20 minutes). More particularly, in the first example, in response to toggling of the high-side TX interrupter (1,J), the defect detector 166 monitors the voltage data from voltmeters (1,J,1), (1,J,2) and (1,J,3). If the voltage data from the three-phase voltmeters 122 indicates that the voltage for two or more phases of the three-phase voltage at the corresponding feeder line 120 has dropped to a level of about two-thirds of a full level or less (e.g., one-half of a standard operating voltage) within the predetermined amount of time, the defect detector 166 triggers an alert for the upstream high-side TX interrupter 114. In the first example, it is presumed that the measured voltage for at least voltmeter (1,J,1) drops to two-thirds or less of a standard operating voltage on two phases within the predetermined amount of time.

Figure 3:
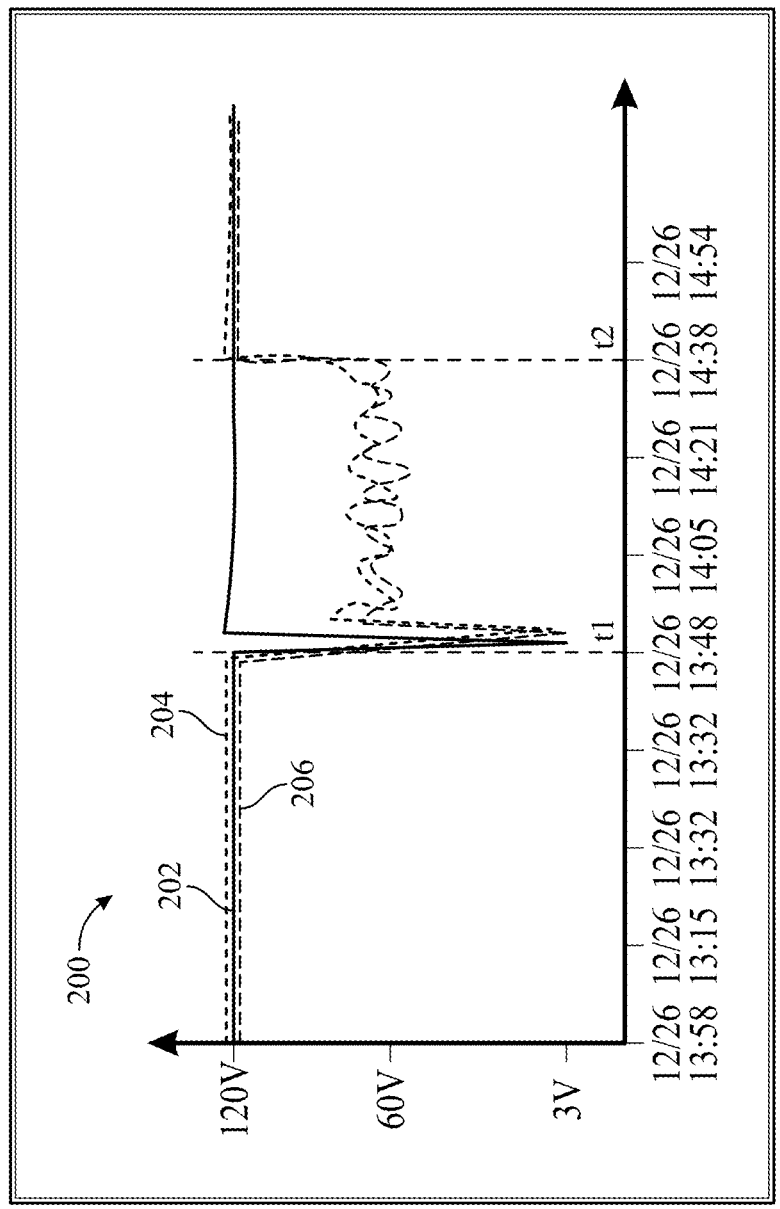
FIG. 3 illustrates a graph of a three-phase power signal.

FIG. 3 illustrates a chart 200 that plots a three phase voltage signal (e.g., corresponding to the voltage data from voltmeter (1,J,1) in the first example) that drops in response to toggling of a high-side TX interrupter (e.g., high-side TX interrupter (1,J) in the first example). The chart 200 plots a feeder line voltage for each of the three-phases as a function of date and time. At time, t1, it is presumed that an upstream high-side TX interrupter (e.g., high-side TX interrupter (1,J) in the first example) is toggled, and in response, a first phase 202, a second phase 204 and a third phase 206 drops from a standard operating voltage level of about 120 V to a voltage near 0 V (e.g., about 3 V). However, the first phase 202 within a short reset time (e.g., within 1 minute) recovers to a level near (e.g., within 5 V) of the standard operating voltage. Conversely, the second phase 204 and the third phase 206 remain at a level of less than two-thirds the standard operating voltage (e.g., within 10 volts of one-half of the standard operating voltage) until time t2. Thus, in this situation, the defect detector 166 of FIG. 2 would trigger the alert for the upstream high-side TX interrupter 114 (e.g., the high-side TX interrupter (1,J) in the first example) based on the voltage drop for the second phase 206 and the third phase 208 after the short reset time (e.g., one minute).

Referring back to FIG. 2, in a second example (hereinafter, "the second example") it is presumed that none of the illustrated switches have been toggled within the predetermined amount of time. However, in the second example, the voltage data provided by voltmeters (K,1,2) and (K,1,3) are each reporting a voltage drop of one-third or more for two phases of the corresponding feeder lines 120. In this situation, the defect detector 166 can identify a high-side TX interrupter 114 upstream and common to both three-phase voltmeters 122, (voltmeter (K,1,2) and (K,1,3)), namely high-side TX interrupter (K,1). Thus, in the second example, the defect detector 166 can generate an alert for the high-side TX interrupter (K,1).

In a third example (hereinafter, "the third example"), it is presumed (again) that none of the illustrated switches have been toggled within the predetermined amount of time. Additionally, in the third example, the voltage data provided by voltmeters (1,J,2) and (K,1,2) are each reporting a voltage drop of one-third or more for two phases of the corresponding feeder lines 120. In this situation, unlike the second example, there is no high-side TX interrupter 114 common to the feeder lines 120 monitored by the voltmeters (1,J,2) and (K,1,2) because the voltmeters (1,J,2) and (K,1,2) are in different substations 104. Accordingly, the defect detector 166 can identify the transmission line switch 112 (labeled "SW-T") that is upstream and common to both of the three-phase voltmeters 122 (voltmeters (1,J,2) and (K,1, 2)). Therefore, in the third example, the defect detector 166 can generate an alert for the transmission line switch 112.

Figure 4:
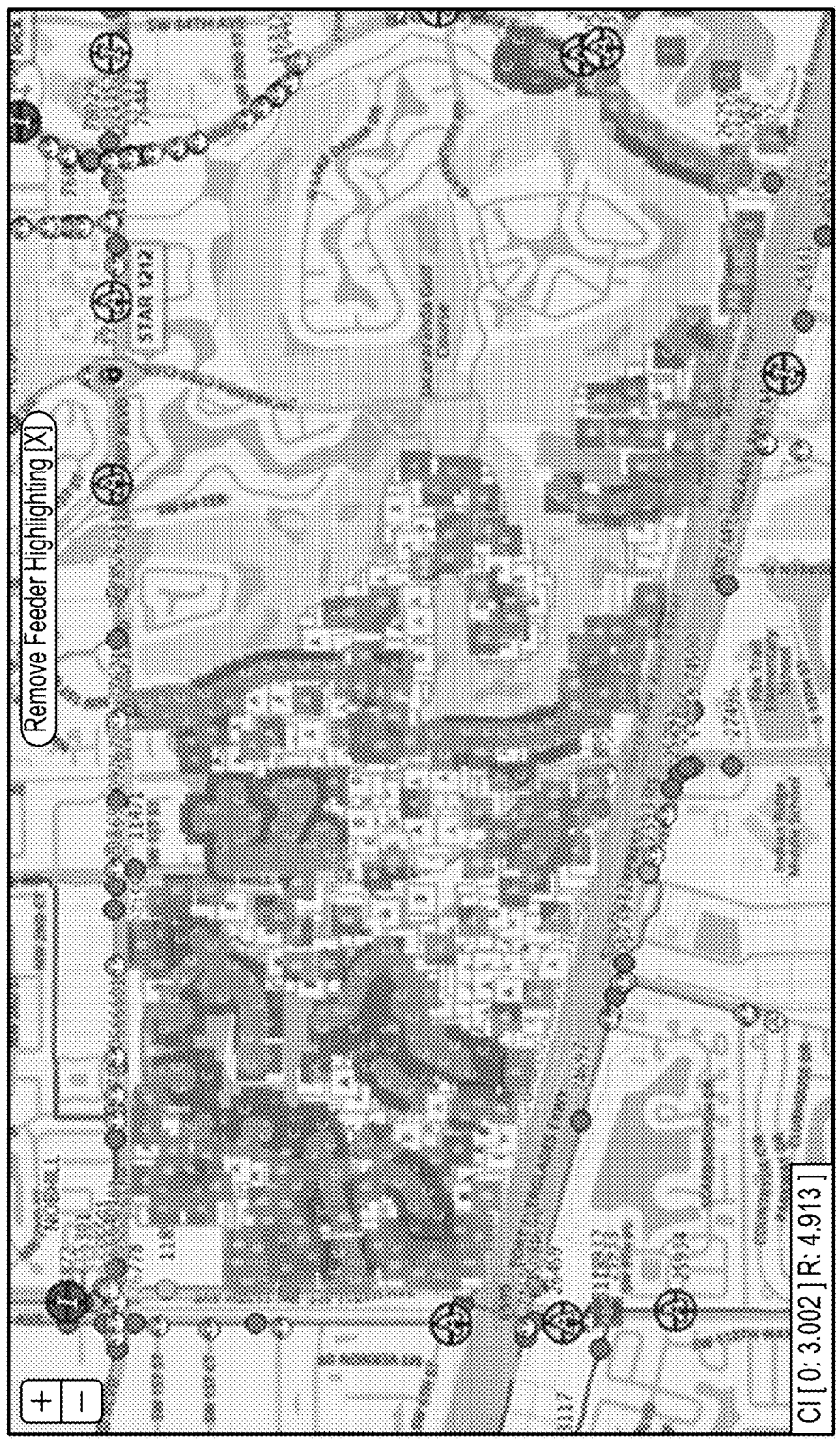
FIG. 4 illustrates an example of a map representing a status of different instances of customer premises.

In each of the first, second and third examples, the defect detector 166 can rescan data from the three-phase voltmeters 122 to confirm the alert. For instance, after a toggling of a switch, the voltage may quickly recover (e.g., within 1 minute), such that the alert may be disabled through the rescan. In some examples, data characterizing the alert can be output by the GUI 160 (e.g., as a chart). Additionally, in some examples, the defect detector 166 can access smart meter (SM) data 170 to identify smart meters that are downstream of a switch (e.g., a high-side TX interrupter 114 or the transmission line switch 112) for which an alert exists. Each identified meter (or some subset thereof) can be pinged by the defect detector 166 (or by another component). The results of the pinging can be output by the GUI 160. FIG. 4 illustrates an example of a map 250 representing a status of different instances of customer premises 130 based on the results of the ping to the smart meters 132.

In the map 250, customer premises labeled "C" are serviced by a first phase of a three phase power signal (e.g., the first phase 202 of FIG. 3 in the first example). Additionally, in the map 250, customer premises labeled "B" are serviced by a second phase of a three phase power signal (e.g., the second phase 204 of FIG. 3 in the first example). Similarly, in the map 250, customer premises labeled "C" are serviced by a second phase of a three phase power signal (e.g., the third phase 206 of FIG. 3 in the first example). In the map 250, customer premises labeled "C" have a first visual indicia (e.g., colored green) indicating that the associated customer premises has a standard operating voltage. Conversely, some customer premises labeled "A" and "B" have a second visual indicia (e.g., colored red or orange) indicating that the associated customer premises is experiencing less than the standard operating voltage (e.g., two-thirds or less than the standard operating voltage). Further, some customer premises labeled "A" and "B" have a third visual indicia (e.g., uncolored/white) indicating that no meter activity for the smart meter for the associated customer premises has been detected within a time range search, which may indicate that the smart meter for the associated customer premises did not have the ability to report a power off message before power was disconnected from the associated customer premises.

Referring back to FIG. 2, upon confirming that the results experienced by the customer premises 130 is consistent with the voltage data from the three-phase voltmeters 122 that triggered the alert, the defect detector 166 can forward the alert to a service ticket manager 172. The service ticket manager 172 can generate a service ticket for inspection of the switch associated with the alert (e.g., the transmission line switch 112 or one of the high-side TX interrupters 114). It is understood that in some examples, the defect detector 166 may not need to confirm the results of the voltage data from the three-phase voltmeters 122 in order to provide the alert to the service ticket manager 172.

The service ticket manager 172 can schedule maintenance of the switch identified in the alert. In particular, the service ticket manager 172 can communicate on a secure network 174 via a secure network interface 176. The secure network 174 can be a private network, a public network, such as the Intranet or a combination thereof (e.g., a virtual private network). Additionally, a service crew 178 can communicate with the service ticket manager 172 via the secure network interface 176. The service ticket manager 172 can provide service ticket to the service crew 178. The service crew 178 (that includes one or more repair technicians) may visit the physical site switch identified in the service ticket, namely the transmission line switch 112 or a high-side TX interrupter 114 located in a substation 104. The service crew 178 can examine, repair and/or replace the switch identified in the alert and close the service ticket, and the service ticket manager 172 can update a record associated with the switch identified in the alert.

Conversely, in some examples, the results of the pings to the smart meters 132 may be inconsistent with the voltage data from the three-phase voltmeters 122 that triggered the alert. For example, if a given one of the three-phase voltmeters 122 is malfunctioning, such that the given three-phase voltmeter 122 reports a drop in voltage for at least two phases of the three-phase voltage provided to the customer premises 130 where no such loss of power exists. In such a situation, the defect detector 166 can prevent the service ticket manager 172 from generating a service ticket for the identified switch. Instead, the defect detector 166 can generate an alert for the given three-phase voltmeter 122 and provide such an alert to the service ticket manager 172 for inspection, repair and/or replacement of the given three-phase voltmeter 122.

By employment of the power distribution system 100, damaged or defective switches on a power distribution system can be detected. More particularly, switches for three-phase power (the transmission line switch 112 or a high-side TX interrupter 114) operating with open poles can be detected without additional installation of hardware. Instead, voltage signals downstream from the switches (e.g., voltage data provided by the three-phase voltmeters 122) can be employed to identify a potentially damaged or defected switch.

Figure 5:
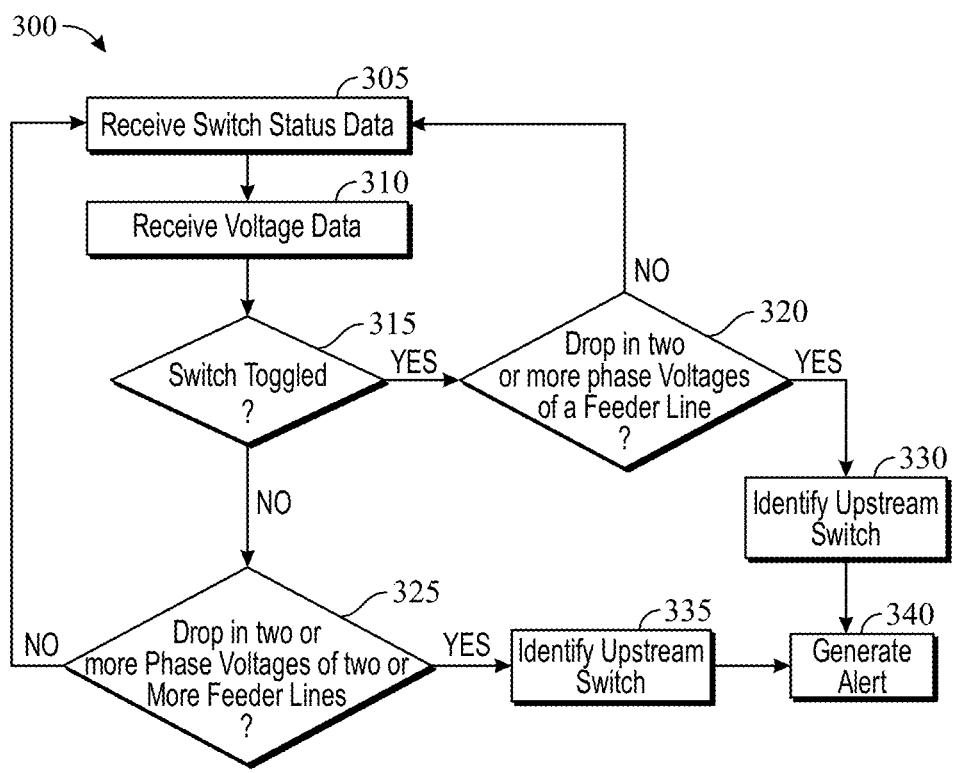
FIG. 5 illustrates a flowchart of an example method for detecting potentially damaged or improper operation of switches in a power distribution system.

In view of the foregoing structural and functional features described above, an example method will be better appreciated with reference to FIG. 5. While, for purposes of simplicity of explanation, the example method of FIG. 5 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 5 illustrates a flowchart of an example method 300 for identifying potential defects (e.g., damaged or improperly operating components such as switches) in a power distribution system. The method 300 could be implemented, for example, by the power distribution system 50 of FIG. 1 and/or the power distribution system 100 of FIG. 2.

At 305, a defect detector (e.g., the defect detector 72 of FIG. 1 and/or the defect detector 166 of FIG. 2) can receive switch data from a utility network (e.g., the utility network 140) or from a SCADA system characterizing a state (e.g., tripped, opened and/or closed) of a plurality of switches (e.g., the high-side TX interrupters 114 and the transmission line switch 112 of FIG. 2) coupled upstream of corresponding three-phase transformers (e.g., the three-phase transformers 52 of FIG. 1 and/or the three-phase transformers 110 of FIG. 2). At 310, the defect detector can receive voltage data (e.g., three-phase voltage data) characterizing a voltage level for each feeder line coupled downstream (e.g., to a secondary winding) of a corresponding three-phase transformer. As illustrated in FIG. 2, the three-phase transformers galvanically isolate the feeder lines from the plurality of switches.

At 315, the defect detector can make a determination as to whether a switch has been toggled (e.g., tripped, opened and/or closed). The determination can be based, for example on the switch status data. If the determination is positive (e.g., YES), the method 300 can proceed to 320. If the determination is negative (e.g., NO), the method 300 can proceed to 325. At 320, the defect detector can make a determination as to whether a voltage drop in two or more phases of a feeder line downstream of the toggled switch (at 315) has been detected within a predetermined amount of time (e.g., 5-20 minutes). If the determination at 320 is negative, (e.g., NO), the method 300 can return to 305. If the determination at 320 is positive (e.g., YES), the method 300 can proceed to 330. At 330, the defect detector can uniquely identify the switch that was toggled at 315.

At 325, the defect detector can make a determination as to whether a drop in two or more phases voltages of two or more feeder lines has been detected. If the determination is negative (e.g., NO), the method 300 can return to 305. If the determination at 300 is positive (e.g., YES), the method can proceed to 335. At 335, the defect detector can uniquely identify a switch upstream and common to each of the two or more feeder lines for which a drop is detected in 325. The switch identified in 335 can be a high-side TX interrupter in situations where the two or more feeder lines are in the same substation. Alternatively, the switch identified in 335 can be a transmission line switch in situations where the two or more feeder lines are in different substations.

At 340, the defect detector can generate an alert that the identified switch (at 330 or 335) may be damaged or operating improperly (e.g., open pole). The alert can be employed, for example, to generate a service ticket (e.g., work order) requesting that a service crew inspect and service the identified switch, as discussed herein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system having a non-transitory machine readable medium, the non-transitory computer readable medium having machine executable instructions, the machine executable instructions comprising:
   a defect detector that receives voltage data from a plurality of voltmeters coupled to a respective feeder line of a plurality of feeders positioned downstream from a transformer, the voltage data characterizing a three-phase voltage for each of the plurality of feeder lines, wherein the defect detector generates an alert indicating that a potential defect exists at a switch positioned upstream of the plurality of feeder lines in response to the voltage data indicating:
   (i) a drop in two or more phases of voltage at a given feeder line of the plurality of feeder lines occurred within a predetermined amount of time of toggling of the switch; or
   (ii) a drop in two or more phases of voltage on at least two or more feeder lines of the plurality of feeder lines has occurred.

2. The system of claim 1, wherein the plurality of feeder lines are within a substation.

3. The system of claim 2, wherein the plurality of feeder lines are connected to a secondary winding of a delta-wye transformer.

4. The system of claim 1, wherein the drop in two or more phases of voltage at a given feeder or the two or more feeder lines is about one-half or more of a standard operating voltage.

5. The system of claim 4, wherein the switch is positioned upstream of a primary winding of the delta-wye transformer.

6. The system of claim 5, wherein the given feeder line or the two or more feeder lines are connected to a secondary winding of the delta-wye transformer.

7. The system of claim 1, wherein the defect detector pings a plurality of meters at customer premises downstream from the plurality of feeder lines in response to the alert.

8. The system of claim 7, the machine readable instructions further comprising a service ticket manager that generates a service ticket for inspection of the switch in response to the alert.

9. The system of claim 8, wherein the service ticket is generated in further response to data from the plurality of meters at the customer premises indicating that at least a subset of the customer premises are receiving a voltage that is less than a standard operating voltage.

10. The system of claim 7, the machine readable instructions further comprising a service ticket manager, wherein the defect detector prevents the service ticket manager from generating a service ticket for inspection of the switch in response to determining that the plurality of pinged meters at the customer premises are receiving voltage at a standard operating voltage.

11. A system comprising:
a plurality of three-phase transformers, each having a primary winding and a secondary winding;
a plurality of feeder lines, wherein each feeder line is coupled to the secondary winding of a respective three-phase transformer of the plurality of three-phase transformers;
a plurality of switches, wherein each switch is upstream of the primary winding of a respective three-phase transformer of the plurality of three-phase transformers;
a plurality of three-phase voltage meters, wherein each three-phase voltage meter reads a three-phase voltage of a respective feeder and provides voltage data;
a memory for storing machine executable instructions; and
a processing unit comprising one or more processor cores that access the memory and executes the machine readable instructions, the machine readable instructions comprising:
a defect detector that receives the three-phase voltage data from each of the plurality of three-phase voltmeters, wherein the defect detector generates an alert indicating that a potential defect exists at a given switch of the plurality of switches in response to the voltage data indicating:
  (i) a drop in two or more phases of voltage at a given feeder line of the plurality of feeder lines within a predetermined amount of time of toggling of the given switch; or
  (ii) a drop in two or more phases of voltage of at least two or more feeder lines of the plurality of feeder lines; and
a graphical user interface that outputs data uniquely identifying the given switch from the plurality of switches.

12. The system of claim 11, wherein the plurality of feeder lines are within a substation.

13. The system of claim 11, wherein the drop in two or more phases of voltage at a given feeder line or the two or more feeder lines is about one-half or more of a standard operating voltage.

14. The system of claim 13, wherein each of the plurality of three-phase transformers are delta-wye transformers.

15. The system of claim 14, wherein the given switch is positioned upstream of each of the plurality of delta-wye transformers.

16. The system of claim 13, wherein each feeder line is connected to a wye winding of a corresponding one of the plurality of delta-wye transformers.

17. The system of claim 11, wherein the defect detector pings a plurality of meters at customer premises positioned downstream from the plurality of feeder lines in response to the alert, and the machine readable instructions further comprising:
a service ticket manager that generates a service ticket for inspection of the switch in response to the alert and in response to data from the plurality of meters at the customer premises indicating that at least a subset of the customer premises are receiving a voltage that is less than the standard operating voltage.

18. A method comprising:
detecting, by a defect detector that receives voltage data from a plurality of voltmeters coupled to a respective feeder line of a plurality of feeders positioned downstream from a transformer, at least one of a drop in two or more phases of voltage at a given feeder line of a plurality of feeder lines within a predetermined amount of time of toggling of a switch positioned upstream of the plurality of feeder lines and a drop in two or more phases of voltage of at least two or more feeder lines of the plurality of feeder lines; and
identifying a defect in a switch positioned upstream of the plurality of feeder lines in response to the voltage drop, wherein at least one three-phase transformer galvanically isolates the switch from the plurality of feeder lines.

19. The method of claim 18, wherein each of the plurality of feeder lines are in a substation.

20. The method of claim 18, wherein each of the two or more feeder lines are in different substations.

* * * * *